United States Patent
Odnoblyudov

(10) Patent No.: US 8,536,594 B2
(45) Date of Patent: Sep. 17, 2013

(54) SOLID STATE LIGHTING DEVICES WITH REDUCED DIMENSIONS AND METHODS OF MANUFACTURING

(75) Inventor: Vladimir Odnoblyudov, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 215 days.

(21) Appl. No.: 13/016,183

(22) Filed: Jan. 28, 2011

(65) Prior Publication Data

US 2012/0194103 A1    Aug. 2, 2012

(51) Int. Cl.
*H01L 29/205*    (2006.01)
*H01L 33/00*    (2010.01)

(52) U.S. Cl.
USPC    257/91; 257/92; 257/E33.011; 257/E33.005; 438/42

(58) Field of Classification Search
USPC ....... 257/91, 93, E33.062, E33.065, E33.006; 315/363
See application file for complete search history.

(56) References Cited

U.S. PATENT DOCUMENTS

| | | | |
|---|---|---|---|
| 7,687,811 B2 | 3/2010 | Jang et al. | |
| 2006/0151793 A1* | 7/2006 | Nagai | 257/79 |
| 2006/0169993 A1 | 8/2006 | Fan et al. | |
| 2006/0284195 A1 | 12/2006 | Nagai | |
| 2008/0096297 A1* | 4/2008 | Schiaffino et al. | 438/22 |
| 2008/0303053 A1 | 12/2008 | Lester et al. | |
| 2010/0038669 A1 | 2/2010 | McKenzie | |
| 2010/0059768 A1 | 3/2010 | Hasnain | |
| 2010/0078656 A1 | 4/2010 | Seo et al. | |
| 2010/0096646 A1 | 4/2010 | Jeong | |
| 2010/0109026 A1* | 5/2010 | Onushkin et al. | 257/88 |

OTHER PUBLICATIONS

International Search Report and Written Opinion issued Jun. 22, 2012 in International Application No. PCT/US2011/064828, 7 pages.

* cited by examiner

*Primary Examiner* — Michelle Mandala
*Assistant Examiner* — Shaka White
(74) *Attorney, Agent, or Firm* — Perkins Coie LLP

(57) ABSTRACT

Solid state lighting (SSL) devices (e.g., devices with light emitting diodes) with reduced dimensions (e.g., thicknesses) and methods of manufacturing are disclosed herein. In one embodiment, an SSL device includes an SSL structure having a first region and a second region laterally spaced apart from the first region and an insulating material between and electrically isolating the first and second regions. The SSL device also includes a conductive material between the first and second regions and adjacent the insulating material to electrically couple the first and second regions in series.

34 Claims, 10 Drawing Sheets

SOLID STATE LIGHTING DEVICES WITH REDUCED DIMENSIONS AND METHODS OF MANUFACTURING

TECHNICAL FIELD

The present disclosure is related to solid state lighting ("SSL") devices (e.g., devices with light emitting diodes ("LEDs")) with reduced dimensions (e.g., thicknesses) and methods of manufacturing.

BACKGROUND

SSL devices can have different configurations for electrical contacts. For example, FIGS. 1A and 1B are cross-sectional and plan views of an SSL device 10 with lateral contacts. As shown in FIG. 1A, the SSL device 10 includes a substrate 12 carrying an LED structure 11 comprised of N-type gallium nitride (GaN) 14, GaN/indium gallium nitride (InGaN) multiple quantum wells ("MQWs") 16, and P-type GaN 18. The SSL device 10 also includes a first contact 20 on the N-type GaN 14 and a second contact 22 on the P-type GaN 18. As shown in FIG. 1B, the first and second contacts 20 and 22 can include first and second contact fingers 20a, 20b, 22a, and 22b, respectively. FIGS. 2A and 2B are cross-sectional and plan views of another SSL device 10' with vertical contacts. The first contact 20 includes a plurality of conductive fingers 21 (three are shown for illustration purposes) coupled to one another by a cross member 23. The second contact 22 (FIG. 2B) includes a reflective and conductive material (e.g., aluminum).

SSL devices with vertical contacts are often preferred because of their higher light extraction efficiencies, better thermal properties, and superior current spreading characteristics than those with lateral contacts. However, in the SSL device 10' of FIGS. 2A and 2B, the N-type GaN 14 typically has a large thickness of about 4-6 μm to reduce the dislocation density in the N-type GaN 14 to an acceptable level. The large thickness may also be required for adequate current spreading through the N-type GaN 14 and for roughening and/or forming other light extraction features on the surface of the N-type GaN 14.

Forming thick layers of N-type GaN 14 via epitaxial growth is operationally difficult, time consuming, and expensive. For example, the relatively thick N-type GaN 14 may release stress during cool down of an epitaxial process via formation of cracks in the epitaxial N-type GaN 14. Typically, the substrate 12 includes silicon (Si), sapphire (Al$_2$O$_3$), silicon carbide (SiC), and/or other "non-native" materials because "native" materials (e.g., GaN or InGaN) with usable dimensions are difficult to produce. The non-native materials typically have coefficients of thermal expansion ("CTE") different than that of the N-type GaN 14. Such CTE mismatch may result in thermal stress causing warpage in the substrate 12 and/or other crystal defects in the N-type GaN 14 during epitaxial growth.

DETAILED DESCRIPTION

Various embodiments of SSL devices, assemblies, and methods of manufacturing are described below. As used hereinafter, the term "SSL device" generally refers to devices with LEDs, laser diodes ("LDs"), and/or other suitable sources of illumination other than electrical filaments, a plasma, or a gas. A person skilled in the relevant art will also understand that the technology may have additional embodiments, and that the technology may be practiced without several of the details of the embodiments described below with reference to FIGS. 3A-5.

Figure 1A:
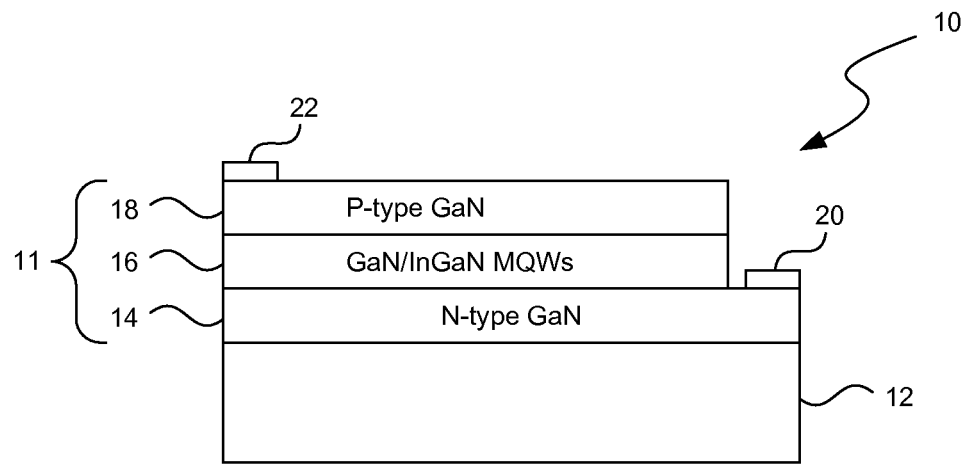
FIG. 1A is a schematic cross-sectional diagram of an SSL device in accordance with the prior art.
Figure 1B:
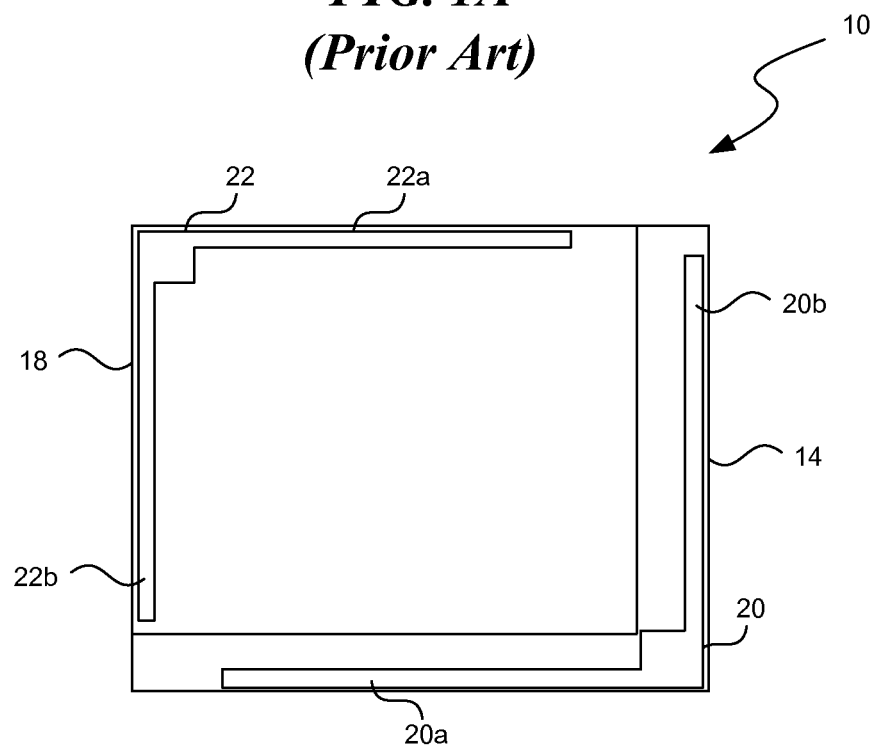
FIG. 1B is a schematic plan view of the SSL device in FIG. 1A.
Figure 2A:
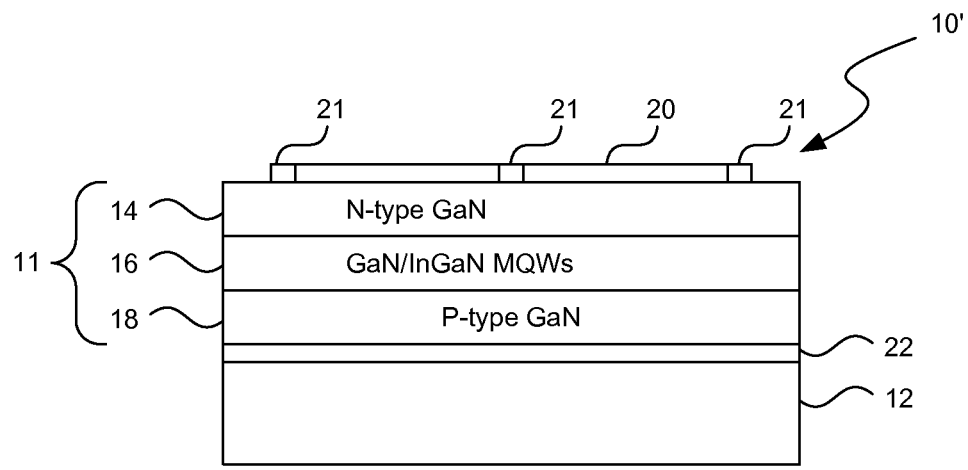
FIG. 2A is a schematic cross-sectional diagram of another SSL device in accordance with the prior art.
Figure 2B:
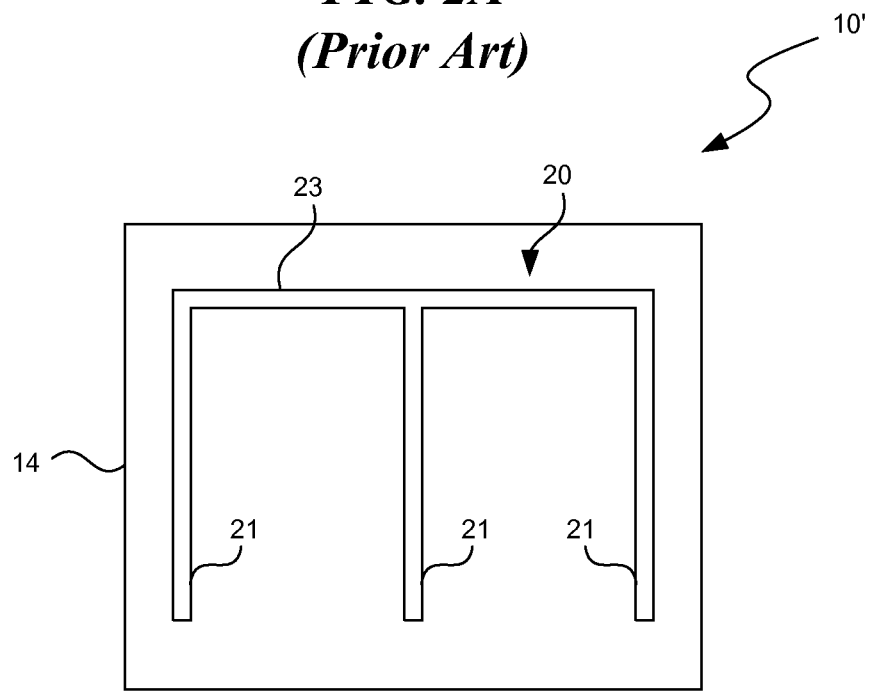
FIG. 2B is a schematic plan view of the SSL device in FIG. 2A.
Figure 3A:
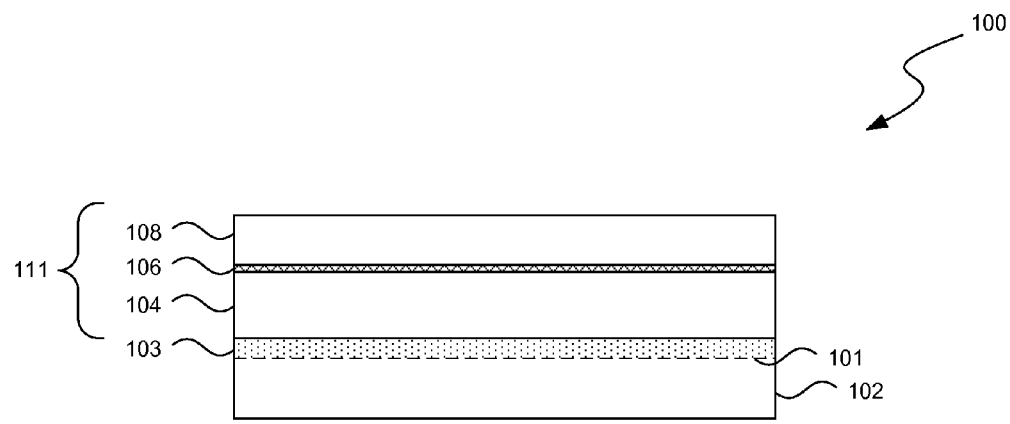
FIGS. 3A-3H are cross-sectional views of an SSL device undergoing a process in accordance with embodiments of the technology.

FIGS. 3A-3H are schematic cross-sectional diagrams of an SSL device 100 undergoing a process in accordance with embodiments of the technology. As shown in FIG. 3A, during an initial stage of the process, an SSL structure 111 may be formed on a substrate material 102 with an optional buffer material 103. In the illustrated embodiment, the SSL structure 111 includes a first semiconductor material 104, an active region 106, and a second semiconductor material 108 stacked in series. In other embodiments, the SSL structure 111 can also include silicon nitride (Si$_3$N$_4$) as an insulator, aluminum nitride (AlN) as a buffer material, and/or other suitable intermediate materials in the SSL structure 111.

In certain embodiments, the substrate material 102 can include silicon (Si), at least a portion of which has the Si(111) crystal orientation. In other embodiments, the substrate material 102 can include silicon with other crystal orientations (e.g., Si(1,0,0)), aluminum-gallium nitride (AlGaN), GaN, silicon carbide (SiC), sapphire (Al$_2$O$_3$), zinc oxide (ZnO$_2$), a combination of the foregoing materials, and/or other suitable substrate materials. In the illustrated embodiment, the substrate material 102 has a generally planar surface 101 proximate the optional buffer material 103. In other embodiments, the substrate material 102 may also include openings, channels, and/or other surface features (not shown).

The optional buffer material 103 can be selected to facilitate the formation of the first and second semiconductor materials 104 and 108 and the active region 106 on the substrate material 102. In certain embodiments, the optional buffer material 103 can include at least one of AlN, AlGaN, zinc nitride (ZnN), GaN, and/or other suitable materials configured to allow adequate wetting of the surface 101 of the substrate material 102 by the first and/or second semiconductor materials 104 and 108. In other embodiments, the optional buffer material 103 may be omitted, and the first semiconductor material 104 may be formed directly on the substrate material 102.

In certain embodiments, the first semiconductor material 104 can include N-type GaN (e.g., doped with silicon (Si)), and the second semiconductor material 108 can include P-type GaN (e.g., doped with magnesium (Mg)). In other embodiments, the first semiconductor material 104 can include P-type GaN, and the second semiconductor material 108 can include N-type GaN. In further embodiments, the first and second semiconductor materials 104 and 108 can individually include at least one of aluminum indium gallium phosphide (AlInGaP), gallium arsenide (GaAs), aluminum gallium arsenide (AlGaAs), gallium arsenide phosphide (GaAsP), gallium(III) phosphide (GaP), zinc selenide (ZnSe), boron nitride (BN), AlGaN, and/or other suitable semiconductor materials. As discussed in more detail later, the first and/or second semiconductor materials 104 and 108 can have a small thickness (e.g., about 1 μm, about 1 μm to about 2 μm, about 2 μm to about 3 μm, or other suitable thickness values) while maintaining adequate current spreading abilities. As a result, the SSL device 100 may be produced with less defects and lower costs when compared to conventional devices.

The active region 106 can include a single quantum well ("SQW"), MQWs, and/or a bulk semiconductor material. As used hereinafter, a "bulk semiconductor material" generally refers to a single grain semiconductor material (e.g., InGaN) with a thickness greater than about 10 nanometers and up to about 500 nanometers. In certain embodiments, the active region 106 can include an InGaN SQW, GaN/InGaN MQWs, and/or an InGaN bulk material. In other embodiments, the active region 106 can include aluminum gallium indium phosphide (AlGaInP), aluminum gallium indium nitride (AlGaInN), and/or other suitable materials or configurations.

In certain embodiments, at least one of the first semiconductor material 104, the active region 106, the second semiconductor material 108, and the optional buffer material 103 can be formed on the substrate material 102 via metal organic chemical vapor deposition ("MOCVD"), molecular beam epitaxy ("MBE"), liquid phase epitaxy ("LPE"), and/or hydride vapor phase epitaxy ("HVPE"). In other embodiments, at least one of the foregoing components and/or other suitable components (not shown) of the SSL structure 111 may be formed via other suitable epitaxial growth techniques.

Figure 3B:
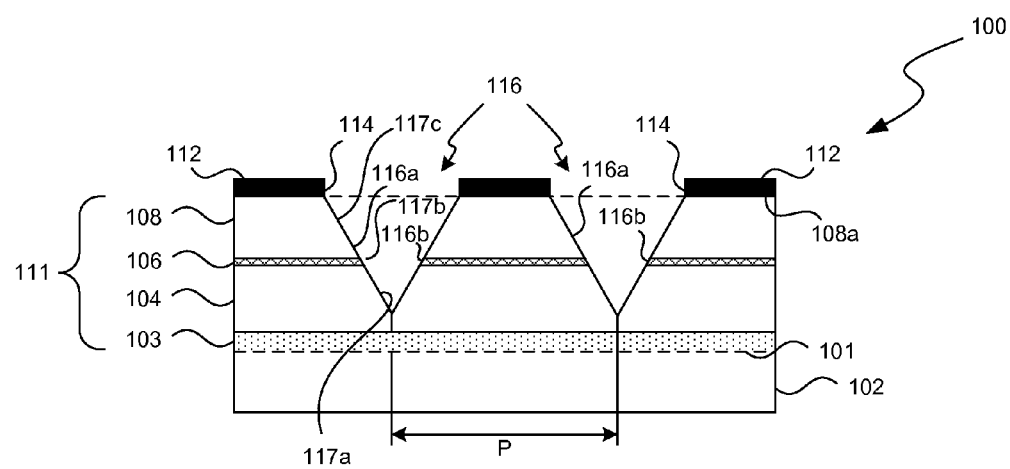

FIG. 3B shows another stage of the process in which a first masking material 112 is deposited on a surface 108a of the second semiconductor material 108 and patterned to form a plurality of first openings 114. The first openings 114 individually expose a portion of the surface 108a (shown with phantom lines) of the second semiconductor material 108. In one embodiment, the first masking material 112 can include a photoresist and may be patterned using photolithography and/or other suitable techniques. In other embodiments, the first masking material 112 can include silicon oxide (SiO$_2$), silicon nitride, and/or other suitable "hard" masking materials that may be patterned by depositing and patterning a photoresist (not shown), and subsequently removing a portion of the first masking material 112 using wet etching, dry etching, and/or other suitable techniques.

As shown in FIG. 3B, another stage of the process includes removing a portion of the SSL structure 111 through the openings 114 in the first masking material 112 and forming one or more laterally spaced indentations 116 in the SSL structure 111. In FIG. 3B, two indentations 116 are shown for illustration purposes though the SSL structure 111 can include one, three, four, or any other suitable number of indentations 116. Techniques for removing the portion of the SSL structure 111 can include reactive ion etching, wet etching, laser ablation, and/or other suitable material removal techniques.

In the illustrated embodiment, the indentations 116 individually include a triangular cross section with a first sidewall 116a and a second sidewall 116b extending from the surface 108a of the second semiconductor material 108 into the first semiconductor material 104 without reaching the optional buffer material 103. The first and second sidewalls 116a and 116b individually include a first part 117a corresponding to the first semiconductor material 104, a second part 117b corresponding to the active region 106, and a third part 117c corresponding to the second semiconductor material 108. In other embodiments, at least one of the indentations 116 may extend up to or even into the optional buffer material 103 and/or the substrate material 102. In further embodiments, the indentations 116 can have a generally rectangular, a "scalloped," a trapezoidal, an oval, and/or other suitable types of cross section, as shown in FIGS. 6A-6D.

In certain embodiments, the process can include selecting a spacing (hereinafter referred to as a "pitch" P) between adjacent indentations 116 based at least in part on a current spread characteristic (e.g., electrical resistance) of the first semiconductor material 104. For example, if the first semiconductor material 104 has a high current spread ability with a low electrical resistance (e.g., with high doping concentrations), a large pitch P may be selected (e.g., about 300 μm to about 500 μm). In other embodiments, the first semiconductor material 104 may have a low current spread ability with a high electrical resistance, and a small pitch P may be selected (e.g., about 100 μm to about 300 μm). In further embodiments, the pitch P may have other suitable spacing values.

Figure 3C:
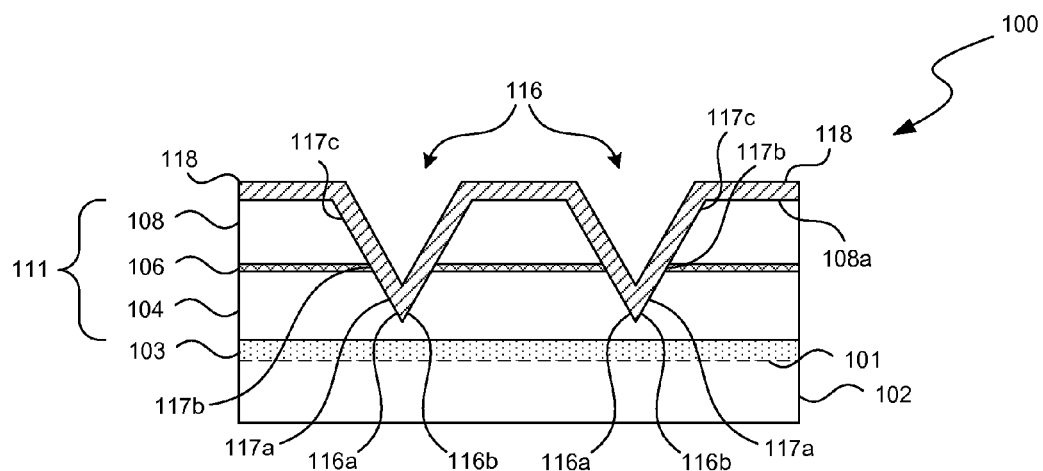

As shown in FIG. 3C, another stage of the process can include depositing an insulating material 118 onto the surface 108a of the second semiconductor material 108 and onto the first and second sidewalls 116a and 116b of the indentations 116. The insulating material 118 can include silicon oxide, silicon nitride, and/or other suitable insulative materials. Techniques for forming the insulating material 118 can include thermal oxidation, chemical vapor deposition ("CVD"), atomic layer deposition ("ALD"), and/or other suitable techniques. In the illustrated embodiment, the insulating material 118 generally conforms to the first and second sidewalls 116a and 116b of the indentations 116. In other embodiments, the insulating material 118 may at least partially fill the indentations 116 and/or can have other suitable configurations.

Figure 3D:
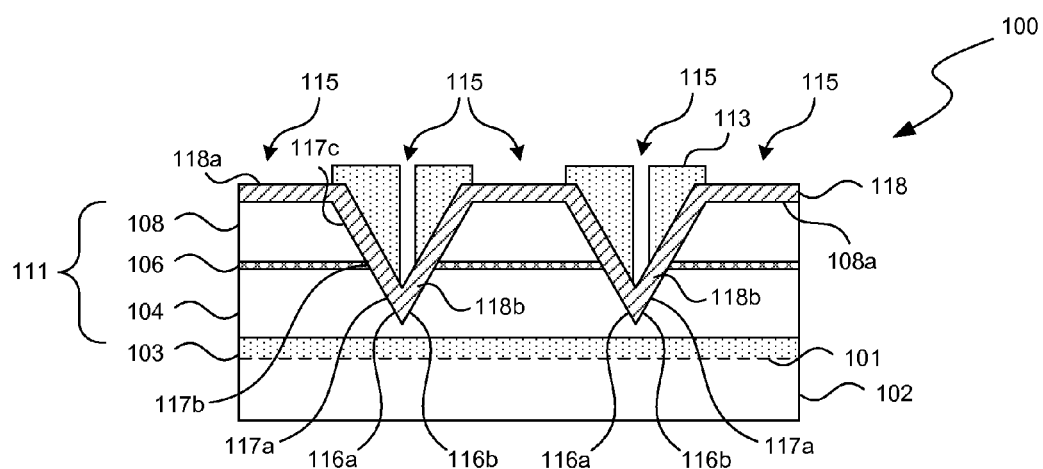

As shown in FIG. 3D, another stage of the process can include forming a second masking material 113 on the insulating material 118 and patterning the second masking material 113 to form a plurality of second openings 115. The second masking material 113 can be generally the same as or different from the first masking material 112 (FIG. 3B). In the illustrated embodiment, the second openings 115 expose a first portion 118a and a second portion 118b of the insulating material 118. The first portion 118a is on the second semiconductor material 108. The second portion 118b is on the second sidewall 116b of the individual indentations 116. In other embodiments, the second openings 115 can also expose other portions of the insulating material 118.

After forming the second openings 115, the process includes removing the first and second portions 118a and 118b of the insulating material 118 through the second openings 115 via reactive ion etching, wet etching, laser ablation, and/or other suitable material removal techniques. In the illustrated embodiment, the material removal operation is stopped at the surface 108a of the second semiconductor material 108 and the second sidewall 116b of the indentations 116. In other embodiments, the material removal may continue to remove a portion of the second semiconductor material 108 and/or the second sidewall 116b.

Figure 3E:
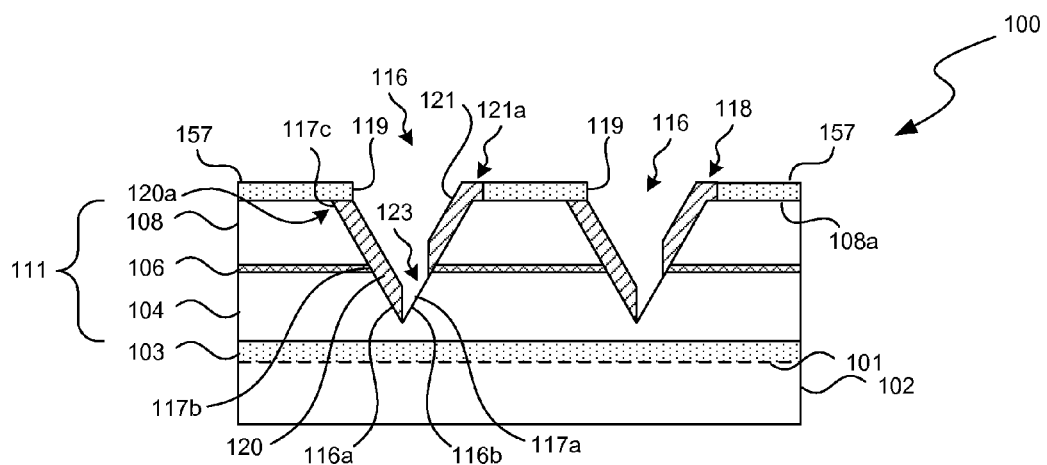

As shown in FIG. 3E, after removing the first and second portions 118a and 118b of the insulating material 118 (FIG. 3D), the remaining insulating material 118 includes a first section 120 on the first sidewall 116a and a second section 121 on the second sidewall 116b of the indentations 116. In the illustrated embodiment, the first section 120 substantially covers the first sidewall 116b and has a first end 120a that is substantially co-planar with the surface 108a of the second semiconductor material 108. The second section 121 only partially covers the second sidewall 116b and has a second end 121a extending beyond the surface 108a of the second semiconductor material 108.

As a result, a gap 123 is formed between the first and second sections 120 and 121 of the insulating material 118 in the individual indentations 116. The gap 123 exposes at least a portion of the first semiconductor material 104. Thus, the second section 121 does not cover at least a portion of the first part 117a of the second sidewall 116b. In other embodiments, the first section 120 may also partially cover the first sidewall 116a and thus exposing a portion of the first semiconductor material 104, as discussed in more detail below with reference to FIG. 5. In the illustrated embodiment, the gap 123 does not expose the active region 106 along the second sidewall 116b, but, in further embodiments, the gap 123 may also expose a portion of the active region 106 at least on the second sidewall 116b.

Continuing on with FIG. 3E, another stage of the process can include forming a third masking material 157 on the surface 108a of the second semiconductor material 108 and patterning the third masking material 157 to form a plurality of third openings 119. The third openings 119 individually expose at least a portion of the indentations 116.

Figure 3F:
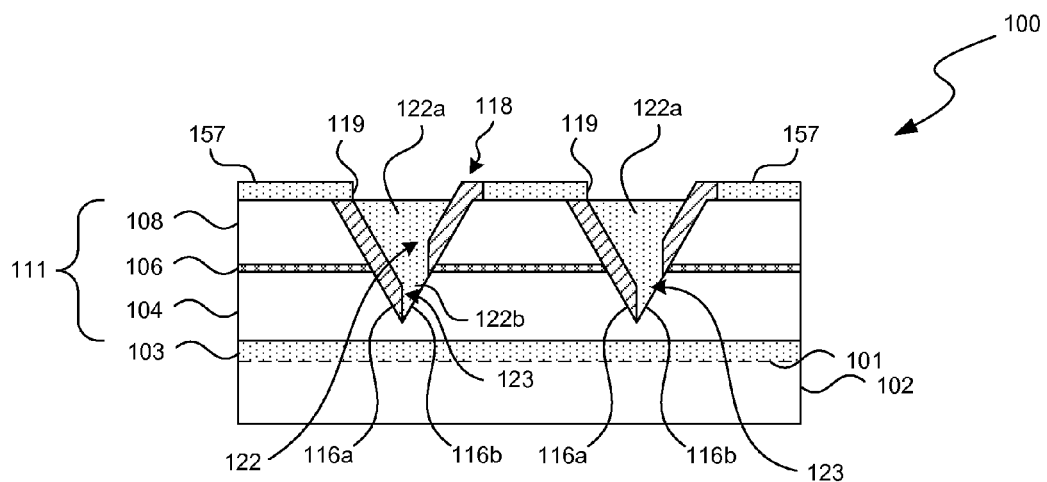

As shown in FIG. 3F, the process can include depositing a conductive material 122 into the indentations 116 through the third openings 119. The conductive material 122 can include copper, aluminum, gold, silver, and/or other suitable metal or metal alloys. Techniques for depositing the conductive material 122 can include CVD, ALD, sputtering, electroplating, and/or other suitable deposition techniques. In the illustrated embodiment, the conductive material 122 includes a first end 122a that is generally co-planar with the surface 108a of the second semiconductor material 108. The conductive material 122 also includes a second end 122b in direct contact with the first semiconductor material 104 through the gap 123. In other embodiments, the first end 122a may be recessed from the surface 108a of the second semiconductor material 108. In further embodiments, the second end 122b may be in direct contact with both the first semiconductor material 104 and the active region 106 through the gap 123. Subsequently, the third masking material 157 may be removed from the SSL structure 111.

Figure 3G:
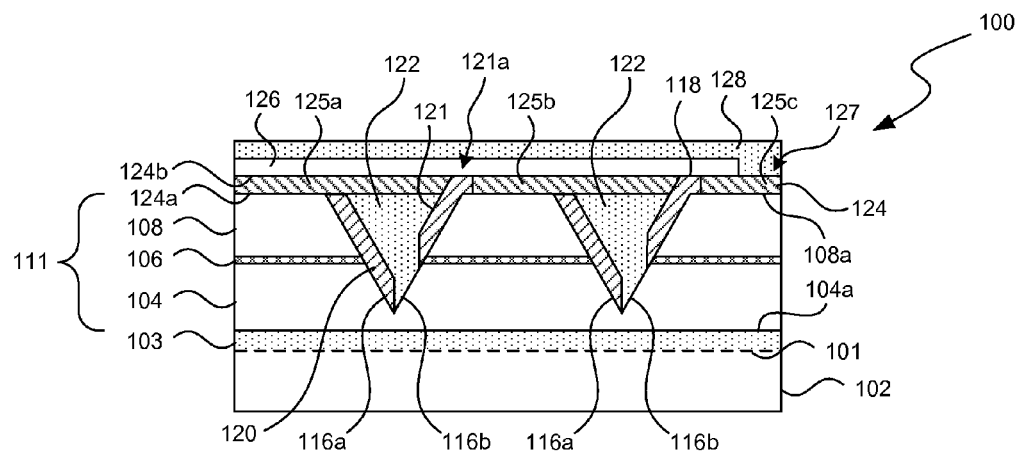

As shown in FIG. 3G, another stage of the process includes forming an electrode 124 on the SSL structure 111. The electrode 124 can include copper, aluminum, gold, silver, and/or another suitable metal or metal alloy formed via CVD, ALD, sputtering, electroplating, and/or other suitable deposition techniques. In the illustrated embodiment, the electrode 124 has a first surface 124a in direct contact with the surface 108a of the second semiconductor material 108. The electrode 124 also has a second surface 124b that is generally co-planar with the second end 121a of the second section 121 of the insulating material 118. As a result, the second section 121 of the insulating material 118 separates and electrically isolates the electrode 124 into a plurality of electrode elements 125 (identified individually as first, second, and third electrode elements 125a, 125b, and 125c). In other embodiments, the second surface 124b may be recessed from the second end 121a of the second section 121 and/or may have other suitable configurations.

Subsequently, a passivation material 126 may be formed on the electrode 124 and the insulating material 118. The passivation material 126 can include silicon oxide, silicon nitride, and/or other suitable non-conductive materials. In the illustrated embodiment, the passivation material 126 includes an opening 127 proximate a peripheral region of the SSL structure 111. In other embodiments, the passivation material 126 can include the opening 127 in other regions of the SSL structure 111.

As shown in FIG. 3G, the process further includes forming a first bonding material 128 on the SSL structure 111. The first bonding material 128 can include copper, a gold/tin alloy, a nickel/tin alloy, and/or other suitable metals or metal alloys formed using CVD, ALD, sputtering, electroplating, and/or other suitable techniques. In the illustrated embodiment, the first bonding material 128 is in direct contact with the electrode 124 via the opening 127 in the passivation material 126. In other embodiments, the first bonding material 128 may be otherwise electrically coupled to the electrode 124.

Without being bound by theory, it is believed that when the first semiconductor material 104 is formed on the optional buffer material 103 (or directly on the substrate material 102), the first semiconductor material 104 initially contains a large number of dislocations proximate the surface 104a. As the epitaxial growth continues, the dislocations coalesce and/or otherwise combine with one another, resulting in higher quality crystal formations. Thus, by removing an initial portion of the first semiconductor material 104 from the surface 104a, the number (or density) of dislocations may be reduced in the first semiconductor material 104.

Figure 3H:
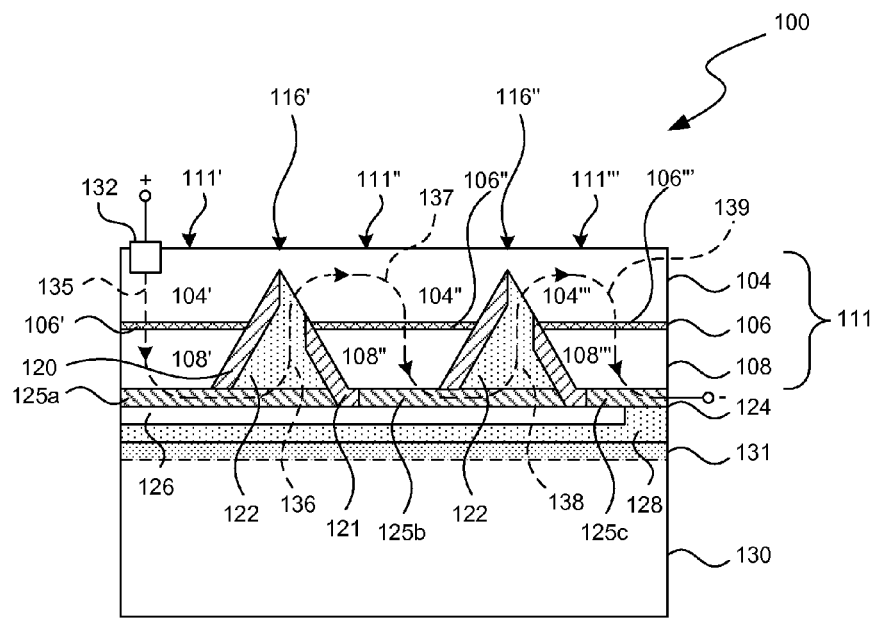

As shown in FIG. 3H, the SSL structure 111 is bonded to a carrier substrate 130 having a second bonding material 131. The carrier substrate 130 can include a ceramic substrate, a silicon substrate, a metal alloy substrate, and/or other suitable types of carrier substrates. The second bonding material 131 can be generally similar to or different from the first bonding material 128. The first and second bonding materials 128 and 131 may be bonded with each other via solid-solid bonding, welding, and/or other suitable techniques. Subsequently, a contact 132 (e.g., a copper contact) may be formed in the first semiconductor material 104.

In the illustrated embodiment, the two indentations 116 (identified as first and second indentations 116' and 116") divide the SSL structure 111 into three regions (identified individually as first, second, and third regions 111', 111", and 111'''). Each of the three regions 111', 111", and 111''' with corresponding portions of the first semiconductor material 104 (identified individually as first semiconductor elements 104', 104", and 104'''), the active region 106 (identified individually as first, second, and third active elements 106', 106", and 106'''), and the second semiconductor material 108 (identified individually as second semiconductor elements 108', 108", and 108''') form three serially coupled junctions in the SSL structure 111.

After bonding the SSL structure 111 to the carrier substrate 130, the substrate material 102 and the optional buffer material 103 may be removed from the first semiconductor material 104 via grinding, exfoliation, wet etching, and/or other suitable techniques. In one embodiment, removing the substrate material 102 and the optional buffer material 103 can be stopped at a surface 104a of the first semiconductor material 104. In other embodiments, the process can also include removing a portion of the first semiconductor material 104 from the surface 104a, which can reduce the dislocation density level in the first semiconductor material 104.

As shown in FIG. 3H, during operation, a voltage may be applied between the contact 132 and the electrode 124. In response, a current (as indicated by the arrow 135) flows from the contact 132 toward the first electrode element 125a of the electrode 124 via the first semiconductor element 104', the first active element 106', and the second semiconductor element 108' in the first region 111'. The first active element 106' converts a portion of the current into light that may be extracted through the first semiconductor material 104.

After reaching the first indentation 116', the current flows from the first electrode element 125a toward the first semiconductor element 104" in the second region 111" via the conductive material 122 in the first indentation 116' (as indicated by the arrow 136). In the second region 111" of the SSL structure 111, the current then flows from the first semiconductor material 104" toward the second electrode element 125b via the active region 106" and the second semiconductor material 108" (as indicated by the arrow 137). The second active element 106" converts another portion of the current into light that may be extracted through the first semiconductor material 104.

After reaching the second indentation 116", the current then flows from the second electrode element 125b to the first semiconductor material 104''' in the third region 111''' of the SSL structure 111 via the conductive material 122 (as indicated by the phantom arrow 138). In the third region 111''' of the SSL structure 111, the current then flows from the first semiconductor material 104''' toward the third electrode element 125c via the third active region 106''' and the second semiconductor material 108''' (as indicated by the arrow 139) before reaching the electrode 124. The third active element 106''' converts a further portion of the current into light that may be extracted through the first semiconductor material 104.

Figure 3I:
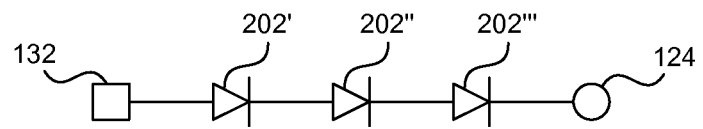
FIG. 3I is a schematic circuit diagram of an SSL device formed by a process in accordance with embodiments of the technology.
Figure 4:
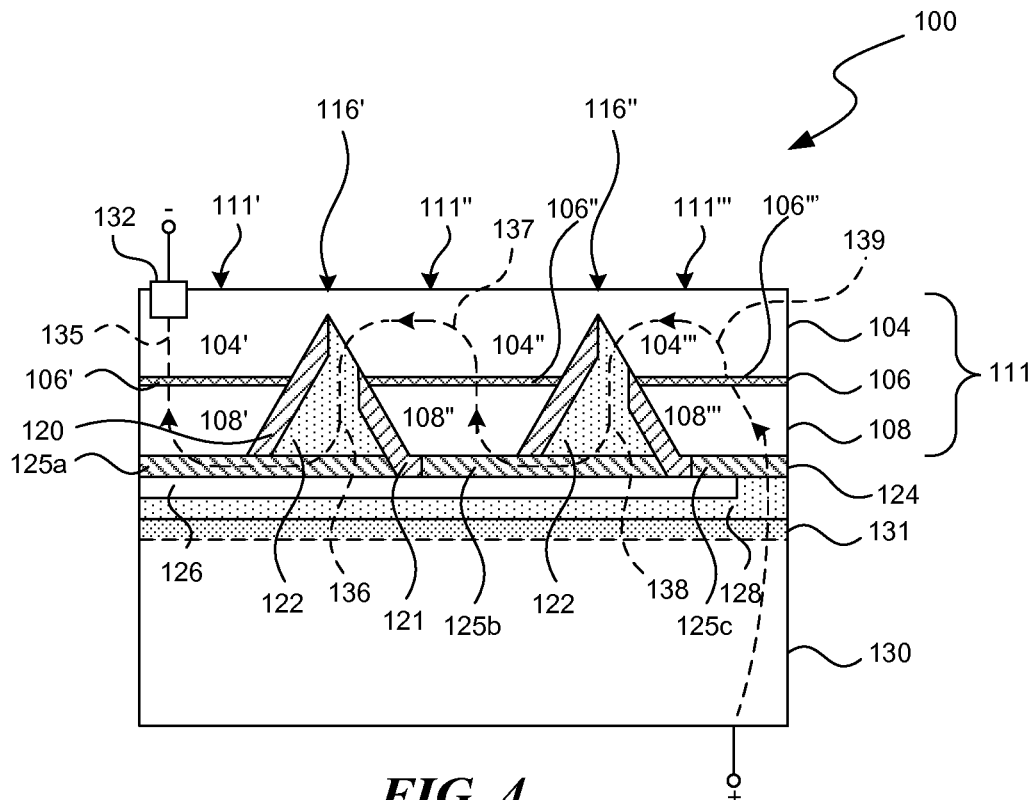
FIG. 4 is a cross-sectional view of an SSL device in accordance with additional embodiments of the technology.

As a result, as shown in FIG. 3I, the first semiconductor elements 104', 104", and 104''', the first, second and third active elements 106', 106", and 106''', and the second semiconductor elements 108', 108", and 108''' form three serially coupled junctions 202 (identified individually as first, second, and third junctions 202', 202", and 202''') corresponding to the first, second and third regions 111', 111", and 111''' in the SSL structure 111, respectively. As used hereinafter, the term "junction" generally refers to an interfacial space between at least two regions of a semiconductor crystal with opposite or otherwise different charge carrying characteristics. Even though only three junctions 202 are shown in FIG. 4, in other embodiments, the SSL device 100 may include one, two, or other suitable number of junctions 202. In general terms, the SSL device 100 may include N indentations 116 (FIG. 3H) that divide the SSL structure 111 into N+1 junctions 202 with N being a positive integer.

Without being bound by theory, it is believed that the thickness of the first and/or second semiconductor materials 104 and 108 can be small because the lateral spacing between adjacent regions 111', 111", and 111''' of the SSL structure 111 is small. Thus, a small thickness of the first semiconductor material 104 and/or second semiconductor material 108 may be sufficient to provide adequate lateral current spreading in each of the first, second and third regions 111', 111", and 111'''. The small thickness corresponds to a low epitaxial growth time, and thus the SSL device 100 may be produced more efficiently and cheaply than conventional devices.

Embodiments of the SSL structure 111 can have improved light extraction efficiencies when compared to conventional devices. As shown in FIG. 3H, the SSL structure 111 does not have a non-transparent materials (e.g., metal contact figures) that occupies a significant portion of the first semiconductor material 104 except a small area occupied by the contact 132. Thus, light generated in the active region 106 can be readily extracted through the first semiconductor material 104.

Embodiments of the SSL device 100 can also operate with lower power consumption because the SSL structure 111 may operate at higher voltages than conventional devices. As shown in FIG. 4, the SSL structure 111 includes a plurality of serially coupled junctions 202. If a voltage drop across a single junction is $V_o$ (e.g., 3 volts), then the SSL structure 111 may operate at $N \cdot V_o$ with N being the number of junctions. Thus, in certain embodiments, the number of junctions N in the SSL structure 111 may be selected to achieve a desired operating voltage (e.g., 12 volts, 24 volts, 48 volts, or other suitable voltage values). It is believed that voltage down converting in a power supply is more efficient when the output voltage is at higher values. For example, the power supply may operate more efficiently when the output voltage is 24 volts instead of 12 volts. As a result, lighting devices incorporating embodiments of the SSL structure 111 can be more efficient by operating at higher voltage levels than conventional devices.

Even though the SSL device 100 discussed above with reference to FIGS. 3A-3H includes applying a voltage to the electrode 124 and the contact 132, in other embodiments, the carrier substrate 130 can include a conductive or semiconductive material to form an electrode for the SSL device 100, as shown in FIG. 4. In further embodiments, surface features (e.g., roughening, moth eyes, not shown) may be formed on the first semiconductor material 104 after removing the substrate material 102 and the optional buffer material 103.

Figure 5:
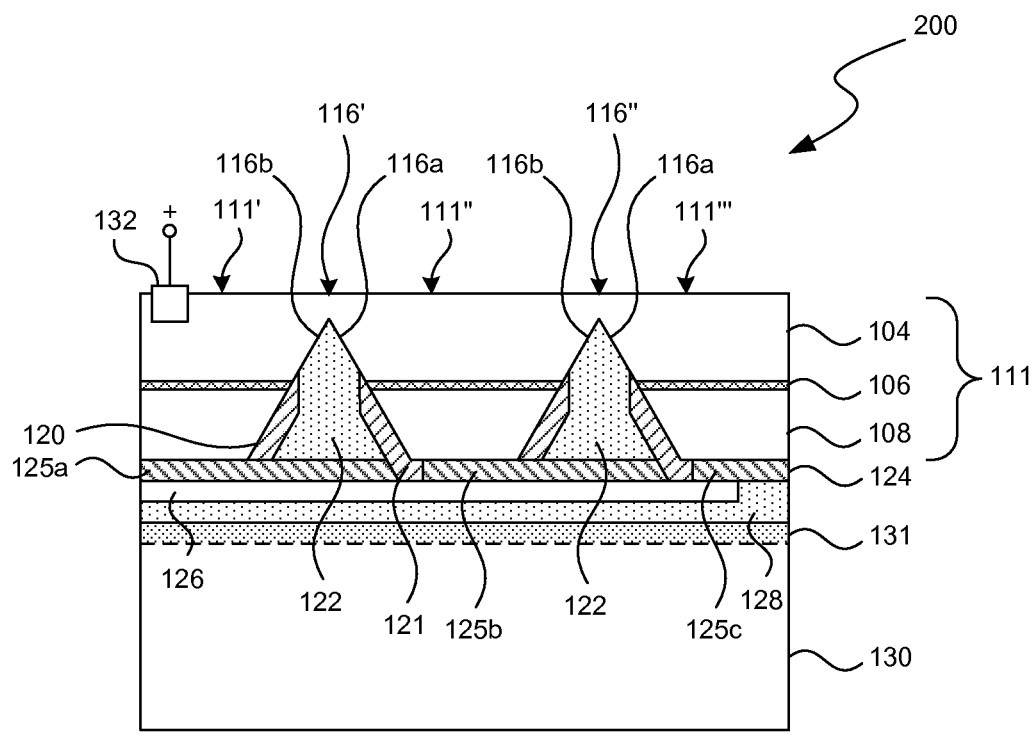
FIG. 5 is a cross-sectional view of an SSL device in accordance with embodiments of the technology.
Figure 6A:
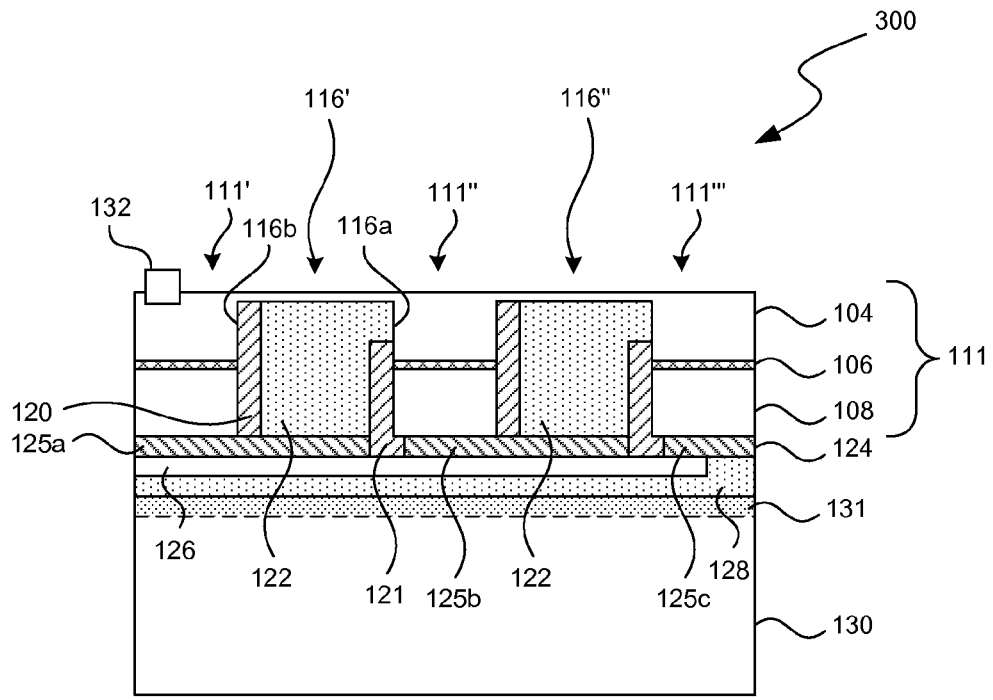
FIGS. 6A-6D are cross-sectional views of an SSL device having different indentation cross sections in accordance with embodiments of the technology.
Figure 6B:
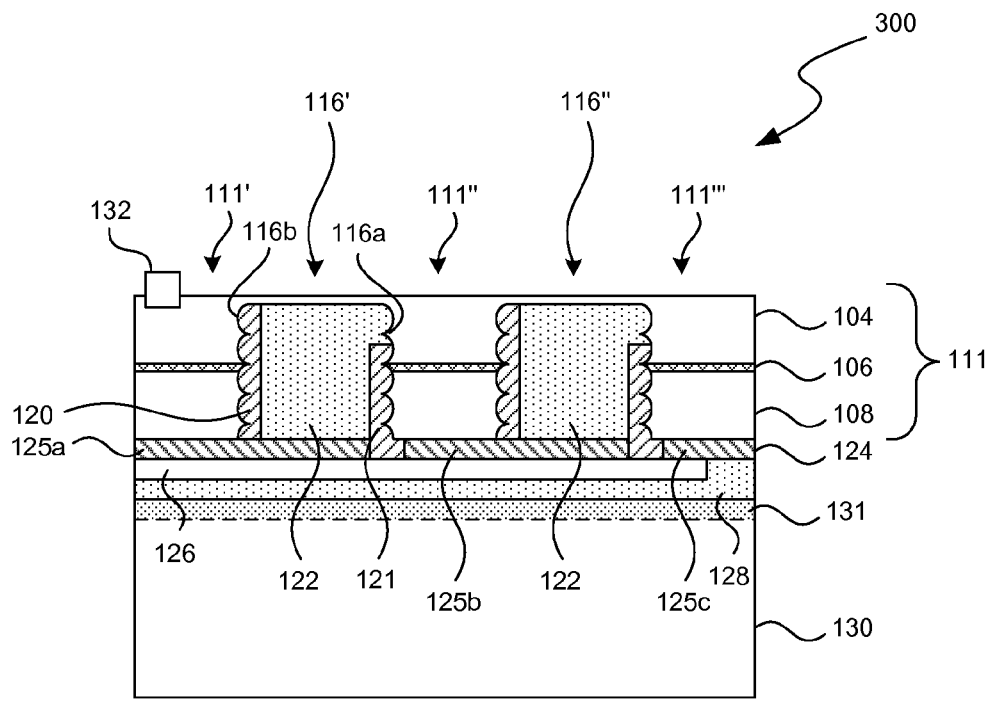
Figure 6C:
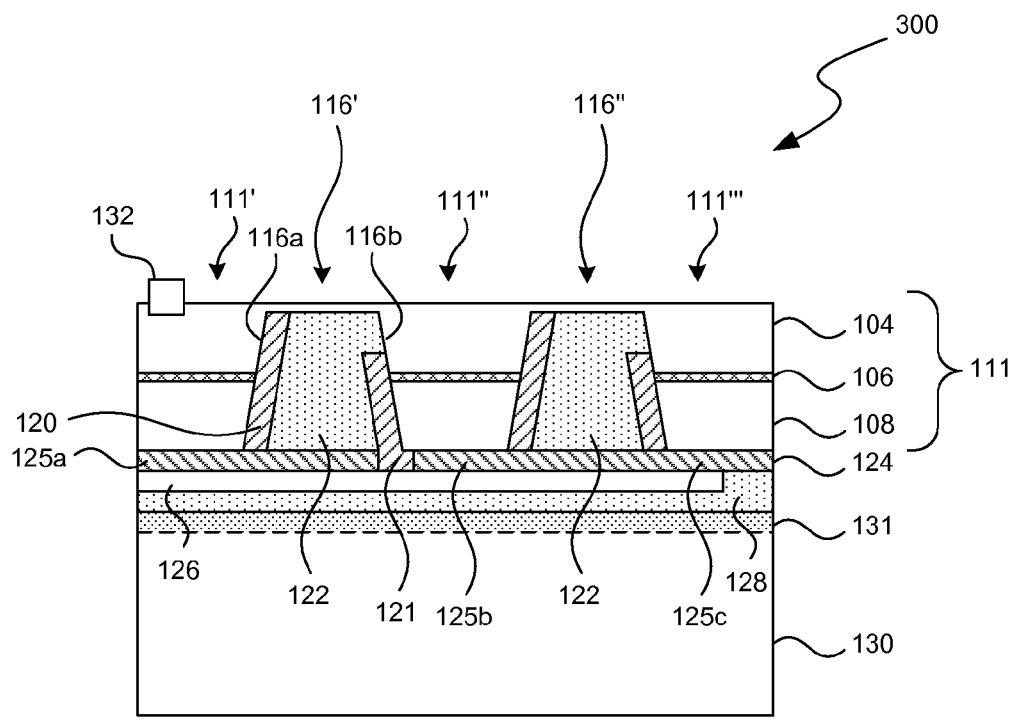
Figure 6D:
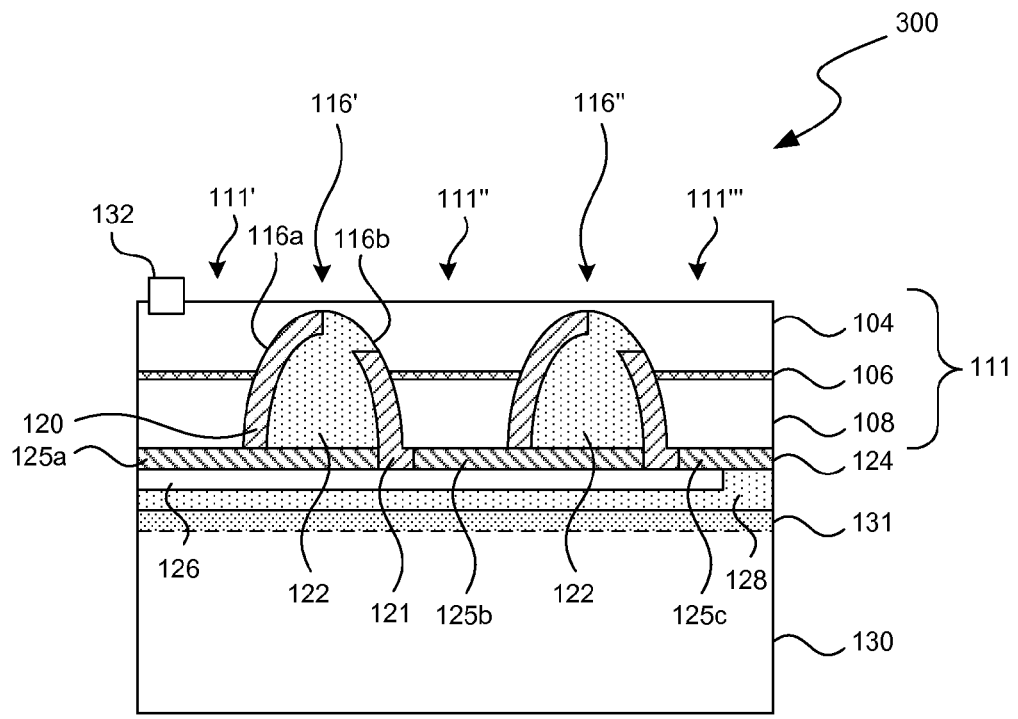

FIG. 5 is a cross-sectional view of an SSL device 200 in accordance with embodiments of the technology. The SSL device 200 includes certain components generally similar to the SSL device 100 in FIG. 3H. However, unlike the SSL device 100 in FIG. 3H, in the SSL device 200, both the first and second sections 120 and 121 of the remaining insulating material 118 only partially cover the first and second sidewalls 116a and 116b, respectively. As a result, the conductive material 122 is in direct contact with the first semiconductor material 104 via both the first and second sidewalls 116a and 116b.

FIGS. 6A-6D are cross-sectional views of an SSL device 300 having different indentation cross sections in accordance with embodiments of the technology. The SSL device 300 includes certain components generally similar to the SSL device 100 in FIG. 3H, except the indentation 116 in the SSL device 300 has a generally rectangular, a "scalloped," a trapezoidal, and an oval cross section in FIGS. 6A-6D, respectively. In further embodiments, the indentation 116 can also include other suitable cross sectional shapes.

From the foregoing, it will be appreciated that specific embodiments of the technology have been described herein for purposes of illustration, but that various modifications may be made without deviating from the disclosure. In addition, many of the elements of one embodiment may be combined with other embodiments in addition to or in lieu of the elements of the other embodiments. Accordingly, the disclosure is not limited except as by the appended claims.

I claim:
1. A solid state lighting (SSL) device, comprising:
a first semiconductor material;
a second semiconductor material spaced apart from the first semiconductor material;
an active region between the first and second semiconductor materials;
an indentation in the first semiconductor material, the active region, and the second semiconductor material;

an insulating material in the indentation covering the second semiconductor material and the active region wherein the insulating material partially covers a sidewall of the indentation with a portion of the first semiconductor material exposed through the insulating material; and a conductive material in the indentation and adjacent the insulating material, the conductive material being in direct contact with the first semiconductor material.

2. The SSL device of claim 1 wherein:
the first semiconductor material includes an N-type gallium nitride (GaN) material;
the second semiconductor material includes a P-type GaN material;
the active region includes GaN/indium gallium nitride (InGaN) multiple quantum wells;
the indentation has a triangular cross section and the sidewall includes a first sidewall and a second sidewall extending into the first semiconductor material from a surface of the second semiconductor material;
the insulating material includes a first insulating portion substantially covering the first sidewall and a second portion partially covering the second sidewall;
the first insulating portion has a first surface opposite a second surface;
the first surface of the first insulating portion is generally co-planar with the surface of the second semiconductor material;
the second surface of the first insulating portion is proximate the first semiconductor material;
the second insulating portion has a first end opposite a second end;
the first end of the second insulating portion extends beyond the surface of the second semiconductor material;
the second end of the second insulating portion extends toward the first semiconductor material;
the insulating material includes a gap between the first and second insulating portions, the gap exposing a portion of the first semiconductor material proximate the second sidewall;
the conductive material is in direct contact with the first semiconductor material through the gap between the first and second insulating portions.

3. The SSL device of claim 1 wherein:
the sidewall extends into the first semiconductor material from a surface of the second semiconductor material.

4. The SSL device of claim 1 wherein:
the sidewall extends into the first semiconductor material from a surface of the second semiconductor material;
the sidewall includes a first part corresponding to the first semiconductor material, a second part corresponding to the active region, and a third part corresponding to the second semiconductor material; and
the insulating material substantially covers the second and third parts of the sidewall and at least does not completely cover the first part of the sidewall.

5. The SSL device of claim 1 wherein:
the sidewall extends into the first semiconductor material from a surface of the second semiconductor material;
the sidewall includes a first part corresponding to the first semiconductor material, a second part corresponding to the active region, and a third part corresponding to the second semiconductor material;
the insulating material substantially covers the second and third parts of the sidewall and at least does not completely cover the first part of the sidewall; and
the conductive material is in direct contact with the first semiconductor material at the first part of the sidewall.

6. The SSL device of claim 1 wherein:
the indentation has a triangular cross section and the sidewall includes a first sidewall and a second sidewall extending into the first semiconductor material from a surface of the second semiconductor material; and
the insulating material includes a first insulating portion substantially covering the first sidewall and a second portion partially covering the second sidewall.

7. The SSL device of claim 1 wherein:
the sidewall extends into the first semiconductor material from a surface of the second semiconductor material;
the insulating material has a first end opposite a second end;
the first end of the insulating material extends beyond the surface of the second semiconductor material; and
the second end of the insulating material extends toward the first semiconductor material.

8. The SSL device of claim 1 wherein:
the sidewall extends into the first semiconductor material from a surface of the second semiconductor material; and
the insulating material has a first end opposite a second end;
the first end of the insulating material extends beyond the surface of the second semiconductor material;
the second end of the insulating material extends toward the first semiconductor material; and
the SSL device further includes a first electrode element and a second electrode element on the surface of the second semiconductor material, the first end of the insulating material physically isolates the first and second electrode elements.

9. The SSL device of claim 1 wherein:
the sidewall extends into the first semiconductor material from a surface of the second semiconductor material;
the insulating material has a first end opposite a second end;
the first end of the insulating material extends beyond the surface of the second semiconductor material;
the second end of the insulating material extends toward the first semiconductor material; and
the SSL device further includes:
a first electrode element and a second electrode element on the surface of the second semiconductor material, the first end of the insulating material physically isolates the first and second electrode elements; and
a contact in the first semiconductor material opposite the first electrode element and laterally spaced apart from the second electrode element.

10. The SSL device of claim 1 wherein:
the sidewall extends into the first semiconductor material from a surface of the second semiconductor material;
the sidewall includes a first part corresponding to the first semiconductor material, a second part corresponding to the active region, and a third part corresponding to the second semiconductor material;
the insulating material substantially covers the second and third parts of the sidewall and at least does not completely cover the first part of the sidewall;
the insulating material has a first end opposite a second end;
the conductive material is in direct contact with the first part of the sidewall;
the first end of the insulating material extends beyond the surface of the second semiconductor material;

the second end of the insulating material extends toward the first semiconductor material; and the SSL device further includes:
a first electrode element and a second electrode element on the surface of the second semiconductor material, the first end of the insulating material physically isolates the first and second electrode elements; and
a contact in the first semiconductor material opposite the first electrode element and laterally spaced apart from the second electrode element.

11. A solid state lighting (SSL) device, comprising:
an SSL structure having a first region and a second region laterally spaced apart from the first region by an indention, wherein the first and second regions individually include a first semiconductor element, a second semiconductor element, and an active element between the first and second semiconductor elements;
an insulating material between the first and second regions, the insulating material covering the second semiconductor element and the active region in an indentation of the SSL structure, the insulating material physically isolating the first and second regions, wherein the insulating material partially covers a sidewall of the indentation with a portion of the first semiconductor element exposed through the insulating material; and
a conductive material between the first and second regions and adjacent the insulating material, the conductive material electrically coupling the first and second regions in series.

12. The SSL device of claim 11 wherein:
the first and/or second semiconductor elements of the first and second regions have a thickness less than about 2 µm.

13. The SSL device of claim 11 wherein:
the first semiconductor element, the active element, and the second semiconductor element of the first region form a first electrical path;
the first semiconductor element, the active element, and the second semiconductor element of the second region form a second electrical path; and
the conductive material electrically couples the first and second electrical paths in series.

14. The SSL device of claim 11 wherein:
the first and/or second semiconductor elements of the first and second regions have a thickness less than about 2 µm;
the first region includes a contact and a first electrode element;
the contact is in the first semiconductor element of the first region;
the first electrode element is adjacent to the second semiconductor element of the first region;
the second region includes a second electrode element laterally spaced apart from the first electrode element;
the indentation is directly between the first and second regions;
the insulating material is at least partially located in the indentation;
the insulating material includes a first insulating portion and a second insulation portion;
the first insulating portion is adjacent to the first region and physically isolates the first semiconductor element, the active element, and the second semiconductor element of the first region from the conductive material;
the second insulating portion is adjacent the second region and physically isolates the active element and the second semiconductor element of the second region from the conductive material;
the second insulating portion also physically isolates the first electrode element from the second electrode element;
the conductive material is in the indentation and between the first and second insulating portions; and
the conductive material forms an electrical path from the first electrode element to the first semiconductor element of the second region.

15. The SSL device of claim 11 wherein:
the first region includes a contact and a first electrode element spaced apart from the contact;
the second region includes a second electrode element laterally spaced apart and physically isolated from the first electrode element; and
the conductive material forms an electrical path from the first electrode element, through the second region, and to the second electrode element.

16. The SSL device of claim 11 wherein:
the first region includes a contact and a first electrode element spaced apart from the contact;
the second region includes a second electrode element laterally spaced apart and physically isolated from the first electrode element; and
the conductive material is directly between and electrically connects the first electrode element to the second region.

17. The SSL device of claim 11 wherein:
the first region includes a contact in the first semiconductor element and a first electrode element adjacent the second semiconductor element of the first region;
the second region includes a second electrode element adjacent the second semiconductor element of the second region; and
the conductive material electrically connects the first electrode element of the first region to the first semiconductor element of the second region.

18. The SSL device of claim 11 wherein:
the first region includes a first electrode element adjacent the second semiconductor element of the first region;
the second region includes a second electrode element adjacent the second semiconductor element of the second region and laterally spaced apart from the first electrode element of the first region; and
the insulating material physically isolates the first electrode element from the second electrode element.

19. The SSL device of claim 11 wherein:
the first region includes a first electrode element adjacent to the second semiconductor element of the first region;
the second region includes a second electrode element adjacent to the second semiconductor element of the second region and laterally spaced apart from the first electrode element of the first region;
the insulating material physically isolates the first electrode element from the second electrode element; and
the conductive material electrically connects the first electrode element of the first region to the second electrode element of the second region via the first semiconductor element, the active element, and the second semiconductor element of the second region.

20. A solid state lighting (SSL) device, comprising:
an SSL structure having a first region and a second region laterally spaced apart from the first region, wherein the first and second regions individually include a first semiconductor element, a second semiconductor element, and an active element between the first and second semiconductor elements;

the first region includes a first electrode element;

the second region includes a second electrode element laterally spaced apart from the first electrode element of the first region; and an insulating material between and physically isolating the first and second electrode elements, wherein the insulating material covers the second semiconductor element and the active region in an indentation of the SSL structure, and wherein the insulating material partially covers a sidewall of the indentation with a portion of the first semiconductor element exposed through the insulating material.

21. The SSL device of claim 20 wherein:

the SSL device further includes a conductive material electrically connecting the first electrode element to the first semiconductor element of the second region.

22. The SSL device of claim 20 wherein:

the first electrode element is in contact with the second semiconductor element of the first region;

the second electrode element is in contact with the second semiconductor element of the second region; and the insulating material extends beyond the second semiconductor elements of the first and second regions and is directly between the first and second electrode elements.

23. A method of forming a solid state lighting (SSL) device, comprising:

forming an SSL structure on a substrate material, the SSL structure having a first semiconductor material proximate the substrate material, a second semiconductor material spaced apart from the first semiconductor material, and an active region between the first and second semiconductor materials;

forming an indentation in the SSL structure, the indentation extending from the second semiconductor material, through the active region, and into the first semiconductor material;

insulating the indentation with an insulating material, the insulating material exposing a portion of the first semiconductor material by partially removing the insulating material from a sidewall of the indentation, thereby forming a gap exposing the portion of the first semiconductor material; and disposing a conductive material in the indentation and adjacent the insulating material, the conductive material being in electrical contact with the first semiconductor material.

24. The method of claim 23 wherein:

forming the SSL structure includes forming the first semiconductor material, the active region, and the second semiconductor material via epitaxial growth, the first semiconductor material having a thickness of less than about 2 μm;

forming the indentation in the SSL structure includes forming the sidewall extending from the second semiconductor material, through the active region, and into the first semiconductor material;

insulating the indentation includes:
depositing the insulating material on the sidewall of the indentation, the insulating material being generally conforming to the sidewall;

disposing the conductive material includes disposing the conductive material in the gap of the insulating material; and the method further includes forming an electrode on the second semiconductor material and the conductive material, the electrode having first and second electrode elements separated by the insulating material.

25. The method of claim 23 wherein:

forming the indentation in the SSL structure includes forming the sidewall extending from the second semiconductor material, through the active region, and into the first semiconductor material;

insulating the indentation includes:
depositing the insulating material on the sidewall of the indentation.

26. The method of claim 23 wherein:

forming the indentation in the SSL structure includes forming the sidewall extending from the second semiconductor material, through the active region, and into the first semiconductor material; and insulating the indentation includes insulating the indentation with the insulating material that does not cover at least the portion of the first semiconductor material.

27. The method of claim 23 wherein:

forming the indentation in the SSL structure includes forming the sidewall extending from the second semiconductor material, through the active region, and into the first semiconductor material; and insulating the indentation includes insulating the indentation with the insulating material having a first end opposite a second end, the first end does not cover at least a portion of the first semiconductor material and the second end extends beyond the second semiconductor material.

28. The method of claim 23 wherein:

forming the indentation in the SSL structure includes forming the sidewall extending from the second semiconductor material, through the active region, and into the first semiconductor material;

insulating the indentation includes insulating the indentation with the insulating material having a first end opposite a second end;

the first end does not cover at least a portion of the first semiconductor material;

the second end extends beyond the second semiconductor material; and the insulating material physically isolates the active region and the second semiconductor material from the conductive material in the indentation.

29. The method of claim 23 wherein:

the sidewall includes a first sidewall and a second sidewall facing the first sidewall, both the first and second sidewalls extending from the second semiconductor material, through the active region, and into the first semiconductor material;

insulating the indentation includes insulating the first and second sidewalls with the insulating material;

the insulating material has a first insulating portion on the first sidewall and a second insulating portion on the second sidewall;

the first insulating portion substantially covers the first sidewall; and the second insulating portion partially covers the second sidewall, thereby forming the gap in the insulating material exposing the portion of the first semiconductor material.

30. The method of claim 23 wherein:

the sidewall includes a first sidewall and a second sidewall facing the first sidewall, both the first and second sidewalls extending from the second semiconductor material, through the active region, and into the first semiconductor material;

insulating the indentation includes insulating the first and second sidewalls with the insulating material;

the insulating material has a first insulating portion on the first sidewall and a second insulating portion on the second sidewall;

the first insulating portion substantially covers the first sidewall;

the second insulating portion partially covers the second sidewall, thereby forming the gap in the insulating material exposing the portion of the first semiconductor material; and disposing the conductive material includes disposing the conductive material between the first and second insulating portions and in the gap.

31. A method of operating a solid state lighting (SSL) device having an SSL structure, the SSL structure having a first region and a second region laterally spaced apart from the first region, the first and second regions individually having a first semiconductor element, a second semiconductor element spaced apart from the first semiconductor element, and an active element between the first and second semiconductor elements, the first region having a contact and a first electrode element, the second region having a second electrode element physically isolated from the first electrode element, the method comprising:

flowing a current from the contact, through the first semiconductor element, the active element, and the second semiconductor element of the first region to the first electrode element;

conducting the current from the first electrode element to the first semiconductor element of the second region in an indentation between the first and second regions of the SSL structure, and wherein an insulating material in the indentation covers the second semiconductor material and the active region, and wherein the insulating material partially covers a sidewall of the indentation with a portion of the first semiconductor material exposed through the insulating material; and flowing the current from the first semiconductor element of the second region, through the active element and second semiconductor element of the second region to the second electrode element.

32. The method of claim 31 wherein conducting the current includes:

conducting the current from the first electrode element to the first semiconductor element of the second region through a conductive material in the indentation between the first and second regions of the SSL structure; and the conductive material is physically isolated from the active elements and semiconductor elements of the first and second regions of the SSL structure.

33. The method of claim 31 wherein:

flowing the current from the contact includes flowing the current from the contact, through the first semiconductor element, the active element, and the second semiconductor element of the first region to the first electrode element in a first direction; and conducting the current includes conducting the current from the first electrode element to the first semiconductor element of the second region in a second direction generally opposite the first direction.

34. The method of claim 31 wherein:

flowing the current from the contact includes flowing the current in a first direction;

conducting the current includes conducting the current in a second direction generally opposite the first direction; and flowing the current from the first semiconductor element includes flowing the current in a third direction generally opposite the second direction.

* * * * *

UNITED STATES PATENT AND TRADEMARK OFFICE
CERTIFICATE OF CORRECTION

| | | |
|---|---|---|
| PATENT NO. | : 8,536,594 B2 | Page 1 of 1 |
| APPLICATION NO. | : 13/016183 | |
| DATED | : September 17, 2013 | |
| INVENTOR(S) | : Vladimir Odnoblyudov | |

It is certified that error appears in the above-identified patent and that said Letters Patent is hereby corrected as shown below:

In the Claims

In column 9, line 2, in Claim 1, delete "region" and insert -- region, --, therefor.

In column 11, lines 13-14, in Claim 11, delete "indention," and insert -- indentation, --, therefor.

Signed and Sealed this
Twenty-sixth Day of November, 2013

Margaret A. Focarino
*Commissioner for Patents of the United States Patent and Trademark Office*